US008946052B2

(12) United States Patent
Nielson et al.

(10) Patent No.: US 8,946,052 B2
(45) Date of Patent: Feb. 3, 2015

(54) PROCESSES FOR MULTI-LAYER DEVICES UTILIZING LAYER TRANSFER

(71) Applicant: Sandia Corporation, Albuquerque, NM (US)

(72) Inventors: Gregory N. Nielson, Albuquerque, NM (US); Carlos Anthony Sanchez, Belen, NM (US); Anna Tauke-Pedretti, Albuquerque, NM (US); Bongsang Kim, Albuquerque, NM (US); Jeffrey Cederberg, Albuquerque, NM (US); Murat Okandan, Edgewood, NM (US); Jose Luis Cruz-Campa, Albuquerque, NM (US); Paul J. Resnick, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 131 days.

(21) Appl. No.: 13/627,425

(22) Filed: Sep. 26, 2012

(65) Prior Publication Data
US 2014/0084450 A1    Mar. 27, 2014

(51) Int. Cl.
*H01L 21/46* (2006.01)
*H01L 21/00* (2006.01)

(52) U.S. Cl.
USPC .............. 438/458; 438/106; 438/455

(58) Field of Classification Search
None
See application file for complete search history.

(56) References Cited

U.S. PATENT DOCUMENTS

| | | | |
|---|---|---|---|
| 6,503,778 B1 * | 1/2003 | Yamauchi et al. | 438/107 |
| 8,313,962 B2 * | 11/2012 | Lott et al. | 438/26 |
| 2001/0036561 A1 | 11/2001 | Wolk et al. | |
| 2008/0108171 A1 | 5/2008 | Rogers et al. | |
| 2010/0330506 A1 | 12/2010 | Knechtel | |
| 2011/0140176 A1 | 6/2011 | Briere | |
| 2011/0223749 A1 * | 9/2011 | Shiomi et al. | 438/493 |
| 2012/0091587 A1 | 4/2012 | Or-Bach et al. | |
| 2013/0196474 A1 * | 8/2013 | Meitl et al. | 438/127 |

OTHER PUBLICATIONS

International Search Report and Written Opinion of the International Searching Authority mailed Jun. 18, 2014 for PCT/US2013/061641.

* cited by examiner

*Primary Examiner* — Charles Garber
*Assistant Examiner* — Evren Seven
(74) *Attorney, Agent, or Firm* — Martin I. Finston

(57) ABSTRACT

A method includes forming a release layer over a donor substrate. A plurality of devices made of a first semiconductor material are formed over the release layer. A first dielectric layer is formed over the plurality of devices such that all exposed surfaces of the plurality of devices are covered by the first dielectric layer. The plurality of devices are chemically attached to a receiving device made of a second semiconductor material different than the first semiconductor material, the receiving device having a receiving substrate attached to a surface of the receiving device opposite the plurality of devices. The release layer is etched to release the donor substrate from the plurality of devices. A second dielectric layer is applied over the plurality of devices and the receiving device to mechanically attach the plurality of devices to the receiving device.

17 Claims, 8 Drawing Sheets

US 8,946,052 B2

PROCESSES FOR MULTI-LAYER DEVICES UTILIZING LAYER TRANSFER

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates in general to semiconductor devices having multiple functionalities, in particular integrally formed semiconductor devices having microelectronic and optoelectronic applications.

BACKGROUND

Silicon wafers are used in the fabrication of integrated circuits (ICs) and other microelectronic systems (MEMS) devices. The wafer serves as the substrate for fabrication of microelectronic devices built in and over the wafer. The wafer therefore undergoes many microfabrication process steps. Once the desired functionality is achieved, the individual devices are separated and packaged.

Silicon wafers, however, have limited functionality. For example, silicon wafers can be fabricated for the purposes of digital or analog processing but are unable to efficiently serve as light emitters and detectors. Rather light emitters and light detectors are typically fabricated from wafers made of compound semiconductor materials, such as group III-V semiconductor materials. In particular, compound semiconductor devices have stronger optical absorption, electrically driven optical emission, high and low band-gaps and higher carrier mobilities than silicon devices. Silicon devices, however, have the advantage of high performance IC processing, materials and micromachining technology.

In many microelectronic systems (MEMS) and optoelectronic applications, it is desirable to use compound semiconductor devices and silicon devices in combination. Combining the devices into one structure, however, has been challenging from a technical standpoint making it commercially unfeasible.

SUMMARY

A method for fabricating devices that are made of multiple layers of different semiconductor devices having different functionalities is disclosed. The method may include forming a release layer over a donor substrate. A plurality of devices made of a first semiconductor material can be formed over the release layer. In one embodiment, the first semiconductor material can be a compound semiconductor material such as a III-V semiconductor material that can be used to form a device having optoelectronic functionalities. A first dielectric layer is formed over the plurality of devices such that all exposed surfaces of the plurality of devices are covered by the first dielectric layer. The plurality of devices can be attached to a receiving device made of a second semiconductor material different than or same as the first semiconductor material. The resulting device can be attached to a receiving substrate. In some embodiments, the receiving substrate is a silicon semiconductor structure having devices that can be processed to have microelectronic and/or optoelectronic functionality. Once the devices are attached together, the release layer can be etched to release the donor substrate from the plurality of devices. A second dielectric layer can be applied over the plurality of devices and the receiving substrate to mechanically attach the plurality of cells to the receiving substrate. A second plurality of cells made of a compound semiconductor material may further be attached to the cells already bonded to the receiving substrate to provide further functionality to the resulting device.

In one embodiment, the resulting device may include a first plurality of devices made of a compound semiconductor material. The compound semiconductor material may be a III-V semiconductor material. A second plurality of devices made of a semiconductor material different than the first plurality of devices can be bonded to the first plurality of devices. For example, the semiconductor material of the second plurality of devices may be silicon. In addition, a dielectric layer may surround the first plurality of devices and the second plurality of devices to mechanically bond the first plurality of devices to the second plurality of devices. The resulting device is therefore an integrated device having the combined characteristics of a compound semiconductor and a silicon semiconductor.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

In this section we shall explain several preferred embodiments of this invention with reference to the appended drawings. Whenever the shapes, relative positions and other aspects of the parts described in the embodiments are not clearly defined, the scope of the invention is not limited only to the parts shown, which are meant merely for the purpose of illustration. Also, while numerous details are set forth, it is understood that some embodiments of the invention may be practiced without these details. In other instances, well-known structures and techniques have not been shown in detail so as not to obscure the understanding of this description.

Figure 1:
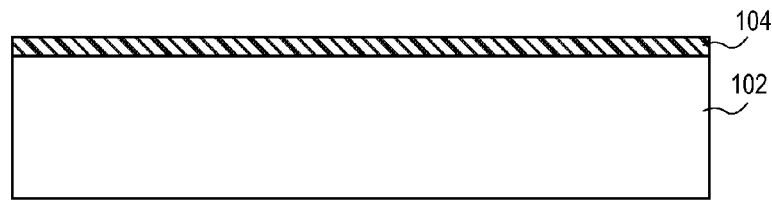
FIG. 1 schematically illustrates a cross-sectional view of one embodiment of a donor substrate having a release layer formed thereon.

FIG. 1 schematically illustrates a cross-sectional view of one embodiment of a donor substrate. Donor substrate 102 may be any type of donor substrate capable of forming a semiconductor device thereon. Representatively, in one embodiment, donor substrate 102 is a wafer made of a compound semiconductor material capable of creating a semiconductor device made of a similar material. For example, donor substrate 102 is made of a group III-V semiconductor material such that a semiconductor device made of a III-V semiconductor material can be epitaxially grown thereon. In one embodiment, the III-V semiconductor material is a compound material such as gallium arsenide (GaAs) or indium gallium phosphide (InGaP). Although specific group III-V semiconductor materials are disclosed, it is contemplated that any semiconductor material may be used. In still further embodiments, the donor substrate 102 may be made of a non-compound semiconductor material capable of forming a semiconductor device thereon. For example, in one embodiment, donor substrate 102 is a non-compound material other than silicon, for example, a group IV material such as silicon (Si) or germanium (Ge).

A sacrificial release layer 104 may be deposited on top of donor substrate 102. Release layer 104 may be made of any material capable of being removed by an etchant that will not substantially remove a protective layer formed on the semiconductor device. Representatively, in one embodiment, release layer 104 may be made of aluminum indium phosphide (AlInP) and, during a later step, etched using hydrogen chloride (HCl). Alternatively, release layer 104 may be made of silicon (Si) and removed with xenon difluoride (XeF2). In still further embodiments, release layer 104 can be made of any material that is different from the protective material, for example, amorphous-Si, porous silicon or spin-on glass. Release layer 104 may be grown over donor substrate 102 using a molecular beam epitaxy (MBE) or metallo-organic chemical vapor deposition (MOCVD) growth process. Alternatively, release layer 104 may be formed by other material deposition processes such as chemical vapor deposition (CVD) or physical vapor deposition (PVD) (e.g. sputtering).

Figure 2:
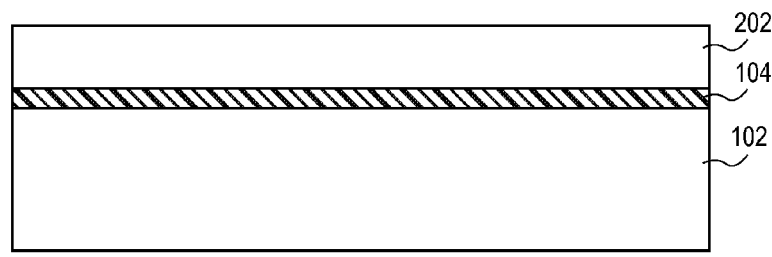
FIG. 2 schematically illustrates a cross-sectional view of one embodiment of a compound semiconductor device layer formed on a release layer.

FIG. 2 schematically illustrates a cross-sectional view of one embodiment of a device layer formed on donor substrate 102. Device layer 202 may be formed on donor substrate 102 after the formation of release layer 104 such that release layer 104 is between compound device layer 202 and donor substrate 102. Device layer 202 may be made of a compound semiconductor material, which in some embodiments, is the same material as donor substrate 102. Representatively, donor substrate 102 may be made of a III-V semiconductor material and device layer 202 may also be a III-V semiconductor material. In one embodiment, device layer 202 is grown over donor substrate 102 using a molecular beam epitaxy (MBE) or metallo-organic chemical vapor deposition (MOCVD) growth process. Alternatively, device layer 202 may be made of a single semiconductor material, for example a group IV semiconductor material such as Ge. Device layer 202 may be made of multiple layers or may be a single layer of semiconductor material. An overall thickness of compound semiconductor device layer 202 may be from about 0.5 microns (μm) to about 5 μm.

Figure 3:
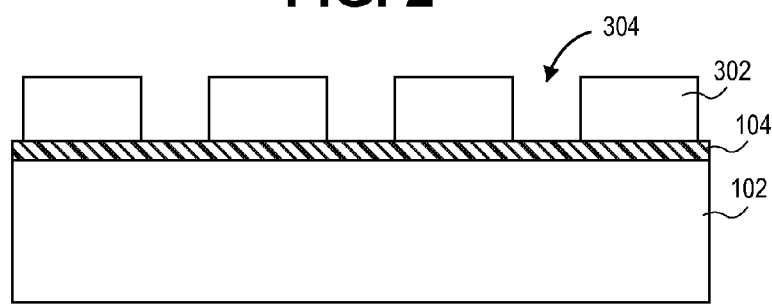
FIG. 3 schematically illustrates a cross-sectional view of one embodiment of compound semiconductor device formed from a compound semiconductor device layer.

Once device layer 202 is formed, compound semiconductor devices 302 may be formed from device layer 202 as illustrated in FIG. 3. Compound semiconductor devices 302, may be, for example, cells having the same or different functionalities. Although devices 302 are referred to as "compound" devices, it is contemplated that compound semiconductor devices 302 are not necessarily made of compound materials. Rather, compound devices 302 may be made of a compound semiconductor material or a single semiconductor material, depending upon the material of device layer 202, as previously discussed. Compound semiconductor devices 302 may be formed by etching trenches 304 down to release layer 104. For example, although not shown, a mask layer (e.g. an oxide layer) may be formed over device layer 202 and patterned to include openings over portions of device layer 202 where trenches 304 are to be formed. A chemical etch (e.g., wet etch or plasma etch) may then be performed to etch through device layer 202. Trenches 304 may extend through an entire thickness of device layer 202 and stop at release layer 202. Alternatively, trenches 304 may be etched through release layer 202.

Figure 4:
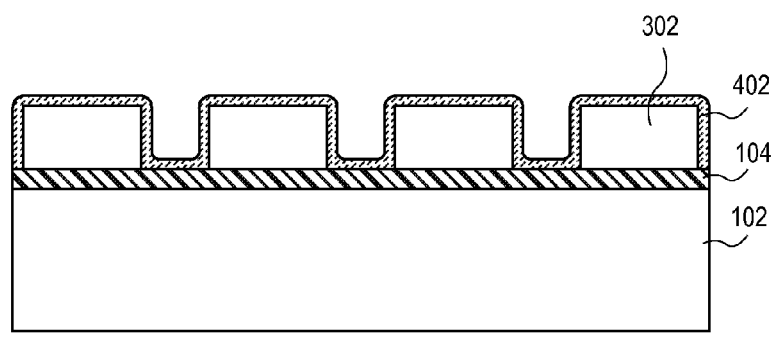
FIG. 4 schematically illustrates a cross-sectional view of one embodiment of compound semiconductor devices covered with a dielectric layer.

Next, dielectric layer 402 is formed over compound semiconductor devices 302 as illustrated in FIG. 4. Dielectric layer 402 may also be formed over portions of release layer 104 which are exposed between compound semiconductor devices 302. Dielectric layer 402 may be formed according to any suitable technique, for example, a plasma enhanced chemical vapor deposition technique.

Dielectric layer 402 serves several purposes. Representatively, dielectric layer 402 helps to bond compound semiconductor devices 302 to a receiving structure as will be described in more detail below. Also, as can be seen from FIG. 4, dielectric layer 402 covers all exposed surfaces of compound semiconductor devices 302. Dielectric layer 402 can therefore also serve as a passivation and sidewall protection layer during etching of release layer 104 as will also be described in more detail below. Dielectric layer 402 may be made of any type of material suitable for serving at least these purposes. Representatively, in one embodiment, dielectric layer 402 may be made of silicon nitride or silicon oxide. In one embodiment, dielectric layer 402 may be a relatively thin layer such that it does not substantially affect the passage of light between compound semiconductor devices 302 and the associated receiving structure. For example, dielectric layer 402 may have a thickness of from about 0.01 µm to about 1 µm. The thickness of dielectric layer 402 may be selected depending upon the desired characteristics of compound semiconductor devices 302. Representatively, a thinner layer may be selected where the optical characteristics of compound semiconductor devices 302 are critical and a thicker layer may be selected where the electrical characteristics of compound semiconductor devices 302 are more important.

Figure 5:
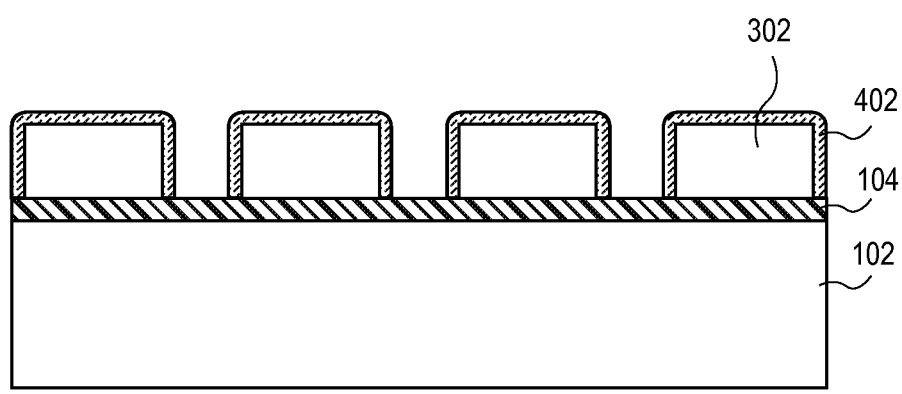
FIG. 5 schematically illustrates a cross-sectional view of one embodiment of an etched dielectric layer.

Portions of dielectric layer 402 between each of the compound semiconductor devices 302 are etched to expose release layer 104 as illustrated in FIG. 5. Representatively, in one embodiment, a masking layer is applied over compound semiconductor devices 302 and a chemical etch (e.g., wet etch or plasma etch) is used to remove the unmasked portions of dielectric layer 402. An example, of a masking layer is an oxide layer that is patterned such that portions of dielectric layer 402 to be removed are exposed. Exposing release layer 104 facilitates removal of release layer 104 during a later processing step.

Figure 6:
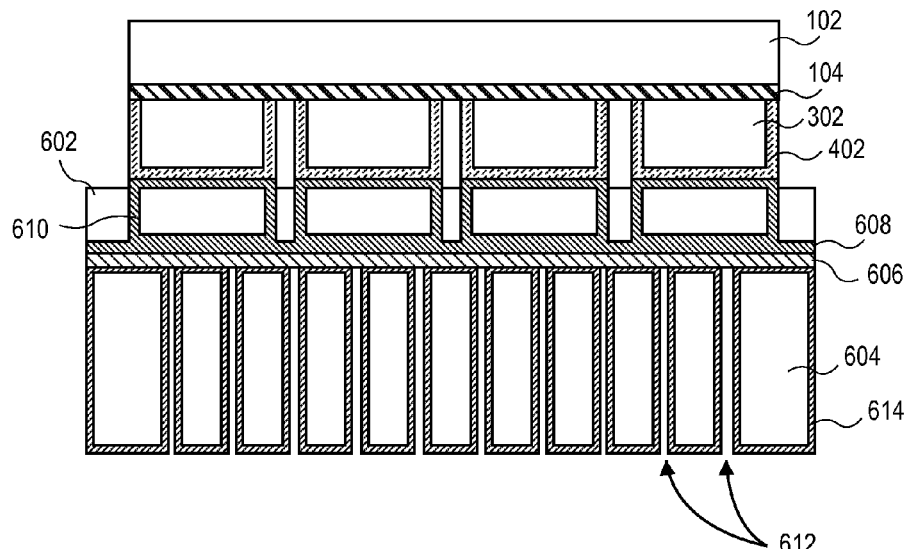
FIG. 6 schematically illustrates a cross-sectional view of one embodiment of compound semiconductor devices attached to a receiving device.

Once compound semiconductor devices 302 are formed on donor substrate 102, donor substrate 102 and compound semiconductor devices 302 are flipped and bonded to the top of receiving structure 602 as illustrated in FIG. 6. Receiving structure 602 may be made of a material other than that of compound semiconductor devices 302. Representatively, where compound semiconductor devices are made of a III-V semiconductor material, receiving structure 602 may be made of silicon. Receiving structure 602 may include receiving devices 610 formed therein which are aligned with and bonded to respective compound semiconductor devices 302. Receiving devices 610 may be silicon semiconductor devices capable of a different functionality than compound devices 302. For example, receiving devices 610 may be fabricated to have microelectronic functionalities while compound semiconductor devices 302 can be fabricated to have optoelectronic functionalities. More specifically, in one embodiment, compound semiconductor devices 302 may have the ability to absorb, generate and modulate different wavelengths of light or generate a piezoelectric response to a mechanical input while receiving devices 610 do not have such functionalities. A dielectric layer 608 may be formed over each of receiving devices 610 to facilitate the bonding process.

The bonding process will now be described in more detail. In one embodiment, a surface activation (plasma) process is performed on compound semiconductor devices 302 according to recognized techniques. A surface activation process may further be performed on receiving devices 610. After the activation, compound semiconductor devices 302 are aligned and brought into contact with receiving devices 610. Chemical bonding between compound semiconductor devices 302 and receiving devices 610 occurs through hydrogen bonding and van der Waals forces between the dielectric layer 402 on compound semiconductor devices 302 and a dielectric layer formed over receiving devices 610. In one embodiment, bonding occurs at room temperature. Representatively, room temperature may be considered a temperature of from about 15 to about 30 degrees Celsius, for example, from 20 to 25 degrees Celsius, or about 23 degrees Celsius. The ability to bond the devices together at room temperature is important because, in embodiments where dielectric layer 402 on compound semiconductor devices 302 and the dielectric layer on receiving devices 610 are made of different materials (e.g. silicon dioxide and silicon nitride), the coefficient of thermal expansion between the dissimilar materials is not the same. Furthermore, the coefficient of thermal expansion of the donor and receiving substrates may have different coefficients of thermal expansion which can cause problems with bonding if the bonding is not done at room temperature. In addition, typical bonding procedures which occur at elevated temperatures can create stress on the device. The ability to bond at room temperature eliminates this stress.

It is recognized that for bonding to occur repeatedly and reliably, the surfaces of compound semiconductor devices 302 and receiving devices 610, having the dielectric layer formed thereon, should be cleaned (no particulates) and smooth (less than a few nm rms roughness).

After the room temperature bonding step, a high temperature annealing process may be used to transform the bonds between the two surfaces into covalent bonds. Representatively, the bonded compound semiconductor devices 302 and receiving devices 610 can be annealed by heating to a temperature between about 150 degrees Celsius and 600 degrees Celsius to strengthen the bond.

In some embodiments, compound semiconductor devices 302 and receiving devices 610 are clamped together under a mechanical load to facilitate the bonding step. Alternatively, no external load is applied depending on the characteristics of the material stack and coefficient of thermal expansion (CTE) mismatches between compound semiconductor devices 302 and receiving devices 610.

As further illustrated in FIG. 6, receiving structure 602 is attached to receiving substrate 604 along a surface opposite compound semiconductor devices 302. An optional release layer 606 may further be formed between receiving structure 602 and receiving substrate 604 to facilitate removal of receiving substrate 604.

In one embodiment, receiving substrate 604 is a structured wafer that includes multiple through holes (e.g., holes 612) (not drawn to scale) that form a pattern on the top surface of receiving substrate 604. Each of holes 612 extends vertically through the thickness of receiving substrate 604. In one embodiment, holes 612 can be formed with uniform spacing among them, with non-uniform spacing among them, or at random locations. Holes 612 can be of the same size or different sizes (e.g., a diameter in the range of 50-500 microns (µm)). In one embodiment, receiving substrate 604 is made of silicon or any silicon-based materials. It is appreciated that receiving substrate 604 can be single crystalline or polycrystalline silicon. In alternative embodiments, receiving substrate 604 can be made of other materials such as ceramic materials. In one embodiment, various additional layers cover the entire surface of receiving substrate 604. It is appreciated that the shape and dimensions of receiving substrate 604 will be dictated, in one embodiment, by the requirements of receiving structure 602 adhered to receiving substrate 604.

Receiving substrate 604 can be manufactured with standard semiconductor processing techniques. In one embodiment, receiving substrate 604 can be formed from a base wafer (e.g., a silicon wafer) with a hard mask deposited thereon. An example of the hard mask is an oxide layer that is patterned to define the size(s) and locations of holes 612. The hard mask exposes the part of the silicon wafer where holes 612 are to be formed. An etchant or a plasma process can then be used to etch through the silicon wafer to form holes 612. The hard mask is removed after holes 612 are formed. A dielectric layer 614 (e.g., an oxide layer and/or a nitride layer) is formed on the entire exposed surface (including the inner surfaces of holes 612 (i.e., the surface that defines the passage or lumen)) of receiving substrate 604, as shown in FIG. 6. In one embodiment, dielectric layer 614 is a thin layer of silicon dioxide with a thickness in the range of 1000 Angstroms-1 micron. It is noted that receiving substrate 604 is formed prior to application of receiving structure 602. Still further, although a structured receiving substrate 604 is described and illustrated it is contemplated that receiving substrate 604 may be any standard, non-structured wafer suitable for processing of a receiving structure 602 and any associated components as described herein. For example, in another embodiment, receiving substrate 604 is solid, without through holes 612.

It is important to note that the features on the surfaces of compound devices 302 and receiving devices 610 are critical to allow the hydrogen gas that is evolving during the bonding process to escape and not cause bonding defects. In particular, during the bonding process certain gases (e.g., hydrogen) may be generated at the surface-to-surface contact ("interface") due to chemical reactions. If the gas is left at this interface, it will migrate and can turn into gas pockets. These gas pockets can become defects, which prevent bonding of the devices. The through passages within receiving substrate 604 as described herein provide a route for the gas such that it can escape the interface.

Figure 7:
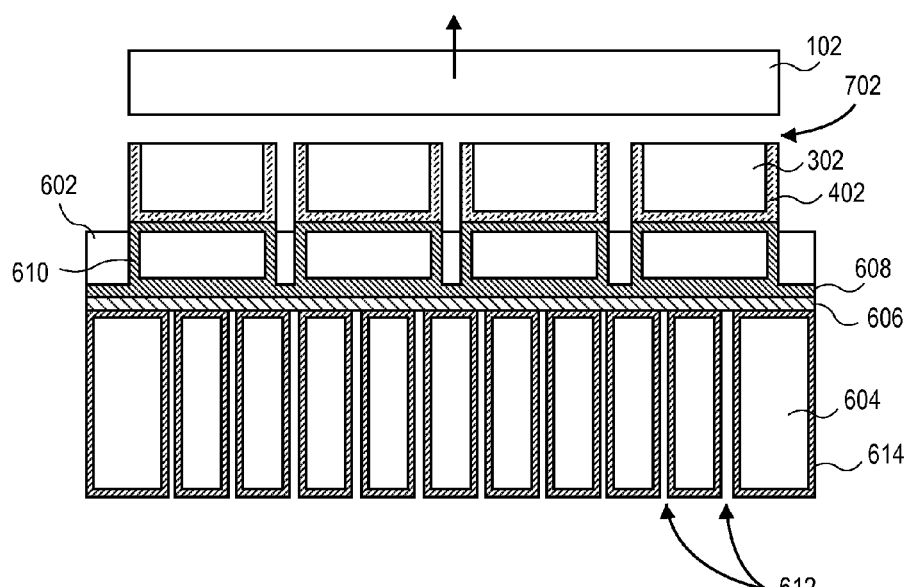
FIG. 7 schematically illustrates a cross-sectional view of one embodiment in which a donor substrate is released from the compound semiconductor devices.

Once compound semiconductor devices 302 are bonded to receiving devices 610, release layer 104 is removed so that donor substrate 402 can be separated from compound semiconductor devices 302 as illustrated in FIG. 7. In one embodiment, a chemical etching process (e.g., wet etch or plasma etch) is used to remove release layer 104. In one embodiment, HCl or $XeF_2$ can be used as an etchant. Since receiving devices 610 and compound semiconductor devices 302 are coated all around their surfaces with dielectric layers 608 and 402, respectively, which are made of a material that is not etched by the etchant, they are not affected by the etchant. Only release layer 104 is exposed to the etchant and will be etched away. The presence of the exposed surfaces between compound semiconductor devices 302 allows the etchant to reach release layer 104. It is further contemplated, that in some embodiments, to accelerate the release process, donor substrate 402 may have a structure similar to receiving substrate 604 such that there are holes through which the etchant can pass to reach release layer 104 from its bottom surface. It is also contemplated that neither donor substrate 402 nor receiving substrate 604 is required to have through holes through which the etchant can pass to accomplish the etching It should be understood that the choice of chemical composition of the release layer 104 is selected so that etching of the release layer 104 does not substantially attack or damage any other layers, particularly, dielectric layers 402, 608. Representatively, as previously discussed, release layer 104 may be made of aluminum indium phosphide (AlInP) and etched using hydrogen chloride (HCl). Alternatively, release layer 104 may be made of silicon (Si) and removed with xenon difluoride ($XeF_2$). Both HCl and $XeF_2$ are selective etchants in that they will not remove the silicon nitride or oxide dielectric layers 402, 608.

In still further embodiments, release layer 104 can be made of spin-on glass, amorphous-Si or porous silicon and dielectric layer 402 can be made of oxide. In other embodiments, release layer 104 is made of oxide and dielectric layer 402 can be made of amorphous-Si or Si-nitrite.

Figure 8:
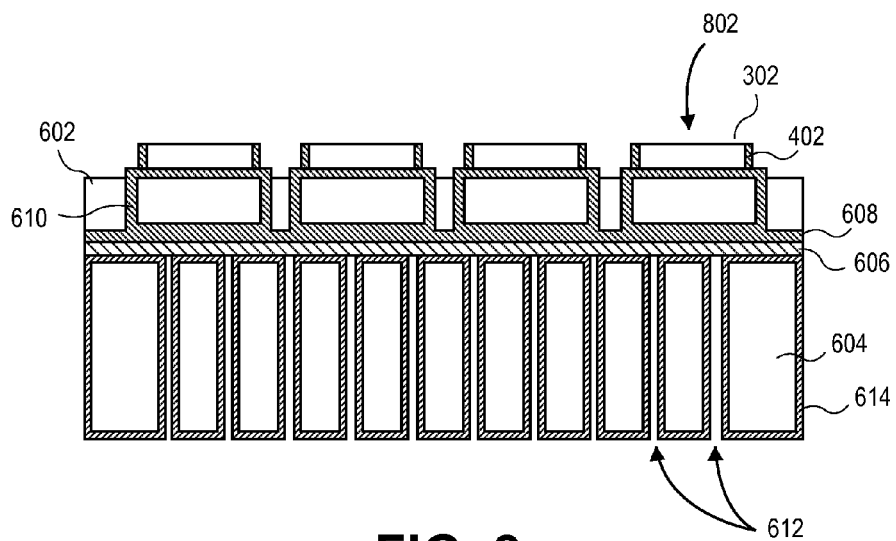
FIG. 8 schematically illustrates a cross-sectional view of one embodiment of compound semiconductor devices attached to a receiving substrate.
Figure 9:
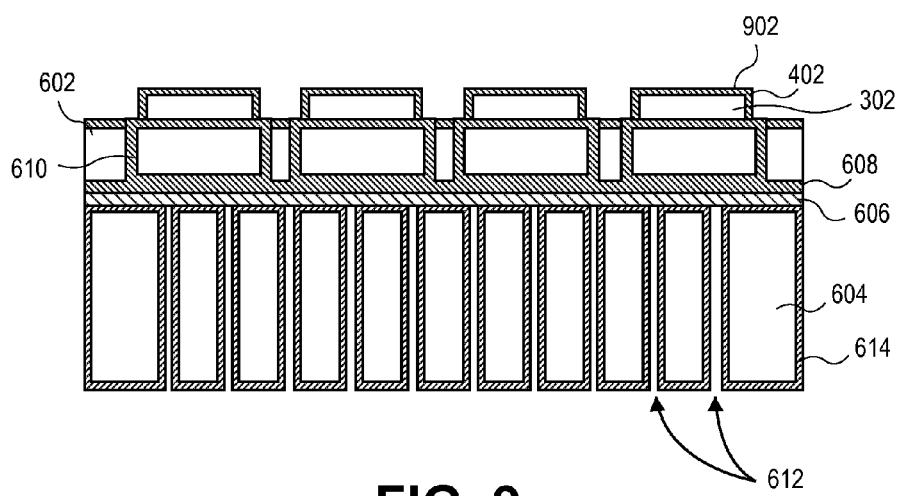
FIG. 9 schematically illustrates a cross-sectional view of one embodiment of a dielectric layer mechanically attaching the compound semiconductor devices to the receiving substrate.

In one embodiment, after compound semiconductor devices 302 are released, donor substrate 102 can be cleaned for reuse. Compound semiconductor devices 302 remain attached to receiving devices 610 as illustrated in FIG. 8 with a bottom surface 802 exposed. A further dielectric layer 902 is then applied over each of compound semiconductor devices 302 and receiving structure 602 as illustrated in FIG. 9. Dielectric layer 902 may be substantially the same as dielectric layer 402 and applied in a similar manner. Dielectric layer 902 covers exposed surface 802 of compound semiconductor devices 302 such that all surfaces of compound semiconductor devices 302 are covered. Additionally, dielectric layer 902 acts to mechanically attach compound semiconductor devices 302 to receiving devices 610 to further reinforce the bonding between the two structures. In this aspect, the initial bonding strength between compound semiconductor devices 302 and receiving devices 610 does not need to be extremely high since a mechanical bonding step, through the encapsulation by dielectric layer 902, is also performed. Although the dielectric encapsulation is not a necessary part of the invention for bond strength or utility of the bonded structures.

Figure 10:
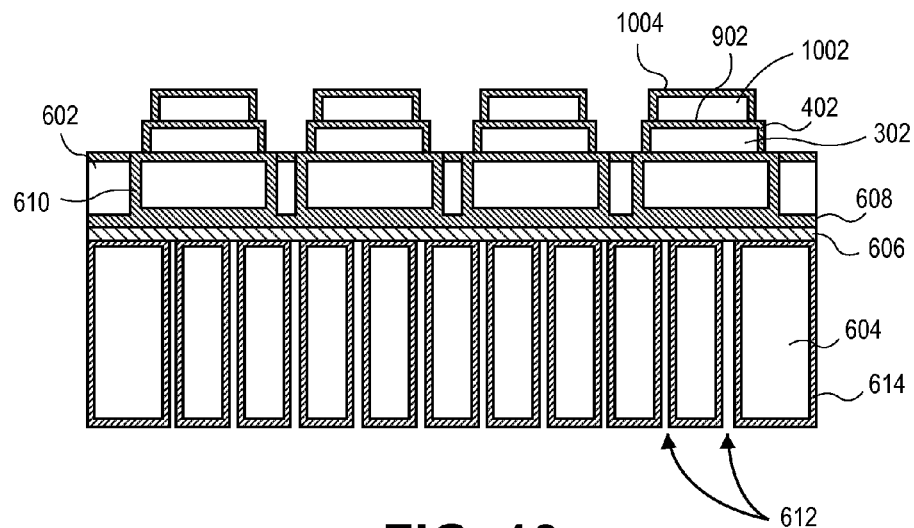
FIG. 10 schematically illustrates a cross-sectional view of one embodiment of a second set of devices attached to the compound semiconductor devices.
Figure 16:
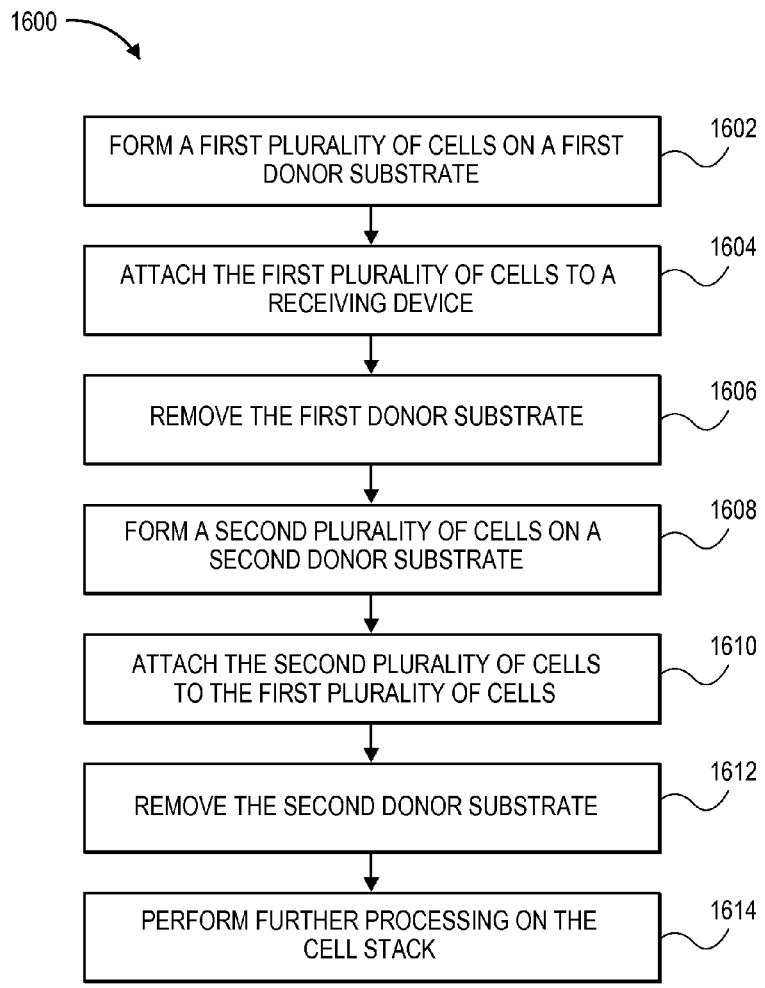
FIG. 16 is a flow diagram of one embodiment of a method of processing devices on a receiving substrate.

A second set of compound semiconductor devices 1002 may also be bonded to the first set of compound semiconductor devices 302 and covered with a further dielectric layer 1004 as illustrated in FIG. 10. Compound semiconductor devices 1002 may be formed and bonded to compound semiconductor devices 302 using substantially the same process steps previously discussed with reference to FIGS. 1-9. A representative process flow for forming the cell stack shown in FIG. 10 is illustrated in FIG. 16. Representatively, process 1600 may include forming the first plurality of devices (e.g., compound semiconductor devices 302) on a first donor substrate (e.g., substrate 102) (block 1602). The first plurality of devices can then be attached to a receiving structure (e.g., structure 602) as previously discussed (block 1604). The receiving structure may include receiving devices which are aligned with the first plurality of devices. The first donor substrate can then be removed from the first plurality of devices as previously discussed to expose a surface of the first plurality of devices (block 1606). The second plurality of devices are formed on a second donor substrate (block 1608) and then attached to the exposed surface of the first plurality of devices (block 1610). The second plurality of devices can be attached to the first plurality of devices using the chemical and/or mechanical bonding steps previously discussed in reference to FIGS. 8-9. Once the first plurality of devices and the second plurality of devices are bonded together, the second donor substrate is removed (block 1612). Further processing may then be performed on the resulting device stack (e.g., compound semiconductor devices 302, devices 1002 and devices 610) to provide the desired functionality (block 1614).

The second set of compound semiconductor devices 1002 may be made of the same material or a different material than compound semiconductor devices 302. Representatively, in one embodiment, compound semiconductor devices 302 and compound semiconductor devices 1002 may be made of the same or different III-V semiconductor materials. For example, compound semiconductor devices 302 may be made of gallium arsenide (GaAs) and compound semiconductor devices 1002 may be made of indium gallium phosphide (InGaP). Alternatively, one of compound semiconductor devices 302 or compound semiconductor devices 1002 may be made of a group IV material (e.g. germanium or silicon) while the other is made of a compound group III-V material. Alternatively, both may be made of the same or a different group IV material.

Once the desired number of compound semiconductor devices are stacked and bonded to receiving structure 602, compound semiconductor devices 302 and 1002 can be processed further, mostly with back-end of the line processes (e.g., deposition/patterning of dielectrics and metals) to complete the desired device configuration. In one embodiment, the temperatures used for the further processing should remain below critical levels (e.g., 250 degrees Celsius) to prevent disruption of the stack of compound semiconductor devices 302 and 1002.

Figure 11:
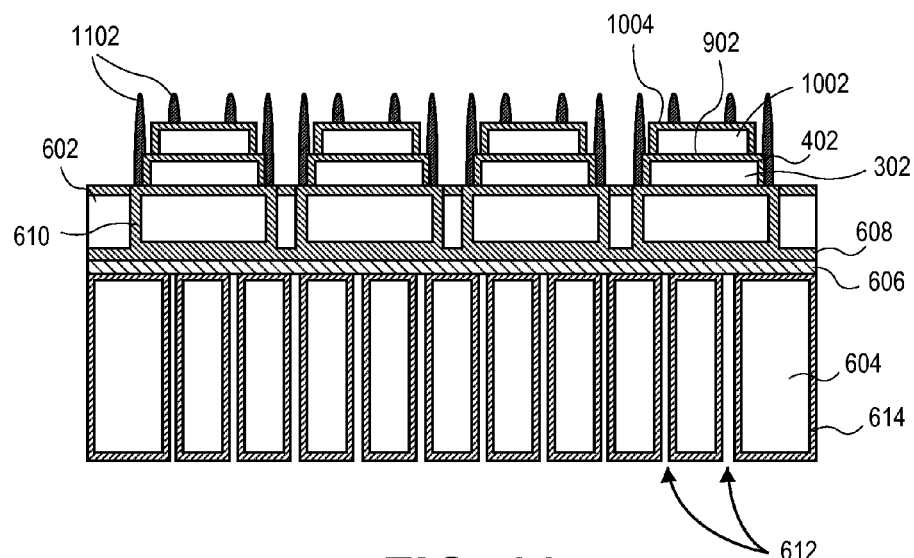
FIG. 11 schematically illustrates a cross-sectional view of one embodiment of metal contacts applied to compound semiconductor devices.
Figure 13:
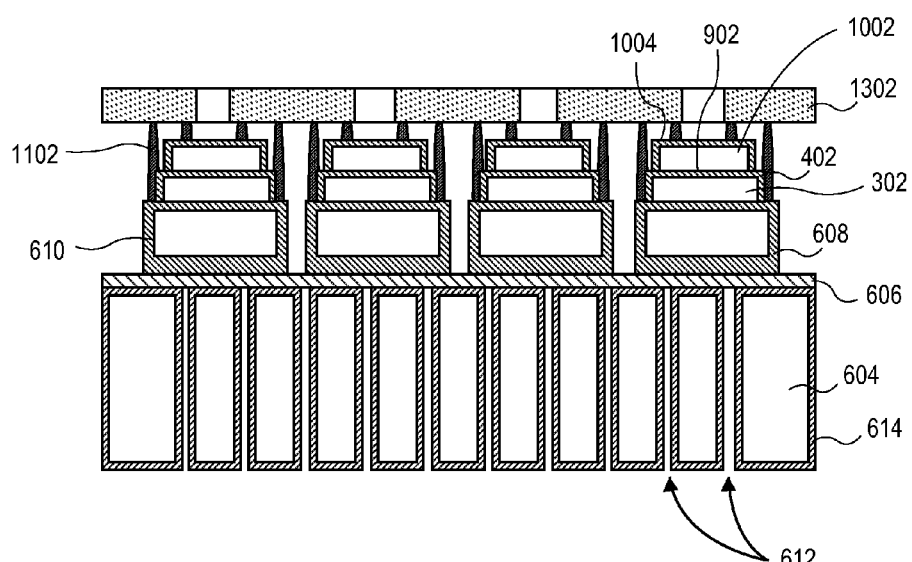
FIG. 13 schematically illustrates a cross-sectional view of one embodiment of a handle substrate attached to compound semiconductor devices.

For example, in one embodiment illustrated in FIG. 11, metal contacts 1102 are deposited and patterned onto compound semiconductor devices 302 and 1002. Metal contacts 1102 (e.g., solder bumps) can be formed on each of compound semiconductor devices 302 and 1002 to connect compound semiconductor devices 302 and 1002 with a final receiving handle substrate 1302, as shown in FIG. 13. Handle substrate 1302 can be a temporary handle (e.g., a tape) or a final assembly substrate.

Figure 12:
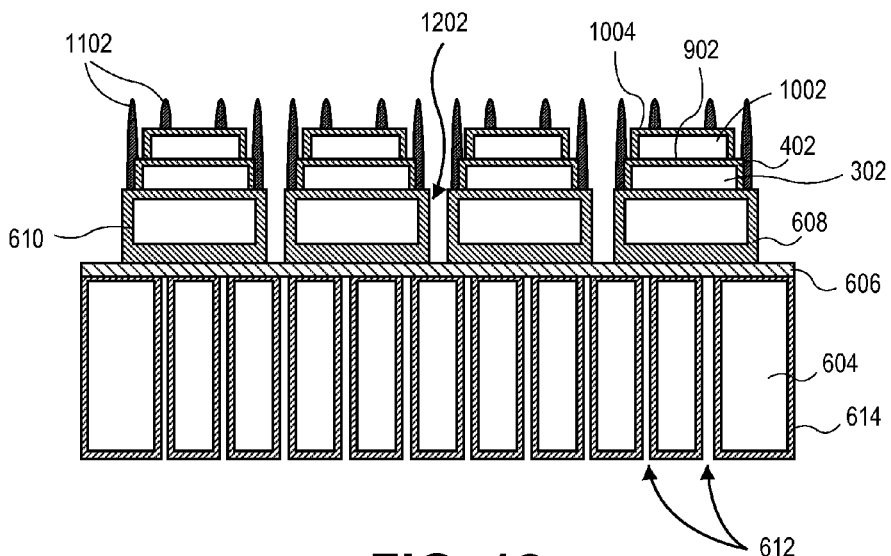
FIG. 12 schematically illustrates a cross-sectional view of one embodiment in which trenches are formed between devices of a receiving substrate.

Prior to attaching devices 302, 610 and 1002 to handle substrate 1302, portions of receiving structure 602 between receiving devices 610 are removed to form trenches 1202 as illustrated in FIG. 12. These portions may be removed through any of the previously discussed etching processes (e.g., a chemical etch).

Figure 14:
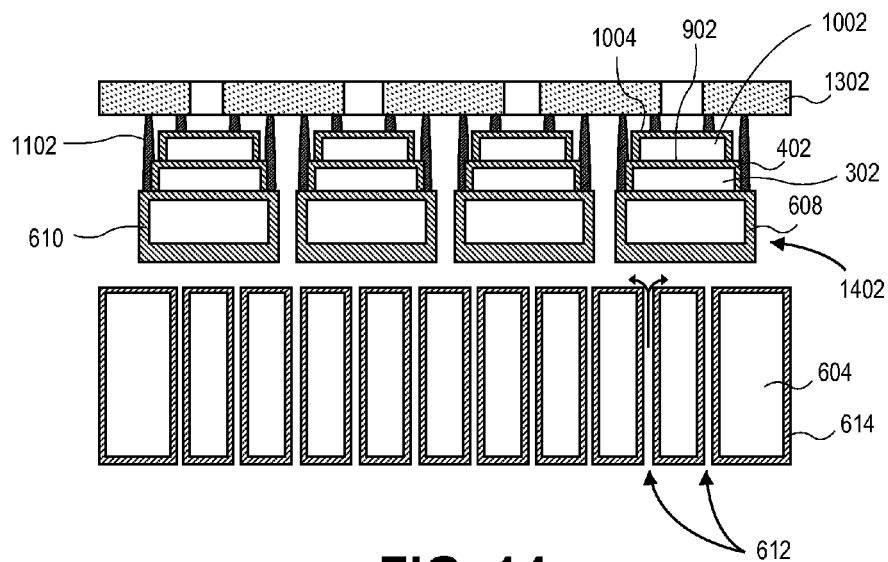
FIG. 14 schematically illustrates a cross-sectional view of one embodiment in which a completed device is released from a receiving substrate.

At the end of device processing, receiving substrate 604 is removed to release the resulting devices 1402 (i.e., receiving devices 610, compound semiconductor devices 302 and compound semiconductor devices 1002), as shown in FIG. 14. In one embodiment, a chemical etching process (e.g., wet etch or plasma etch) is used to remove release layer 606. In one embodiment, xenon difluoride ($XeF_2$) can be used as an etchant. Since each of devices 610, 302 and 1002 have dielectric layers 402, 902 and 1004 all around their surfaces, they are not affected by the etchant. Only release layer 606 is exposed to the etchant and will be etched away. The presence of holes 612 allows the etchant to reach release layer 606 from its bottom surface, in addition to its exposed side/edge surfaces. As a result, the release process can be accelerated. In another embodiment, receiving substrate 604 is solid, without through holes 612, and the release etchant etches the release layer from the side/edge surfaces only.

After devices 1402 are released from receiving substrate 604 with handle substrate 1302, devices 1402 can be separated and re-assembled for a specific configuration, without needing dicing or sawing of the parts.

In some embodiments, after release of the processed devices 1402, receiving substrate 604 can be made available for further reuse. Reusing receiving substrate 604 reduces fabrication and materials costs. This is in contrast to a conventional wafer, which is consumed by the process of device fabrication and cannot be reused.

The resulting devices 1402 are integrally formed devices that are made of different materials having different functionalities. Representatively, devices 1402 can be devices having microelectronic functionalities typically associated with silicon semiconductor devices as well as optoelectronic functionalities typically associated with compound semiconductor devices. For example, devices 1402 may have the functionality of detectors, sensors, photovoltaic (PV) cells, integrated circuits (ICs), micro-machine parts, micro-mechanical parts or electronic components in combination with the light emitting and/or detecting functionalities typically associated with compound semiconductor devices.

Figure 15:
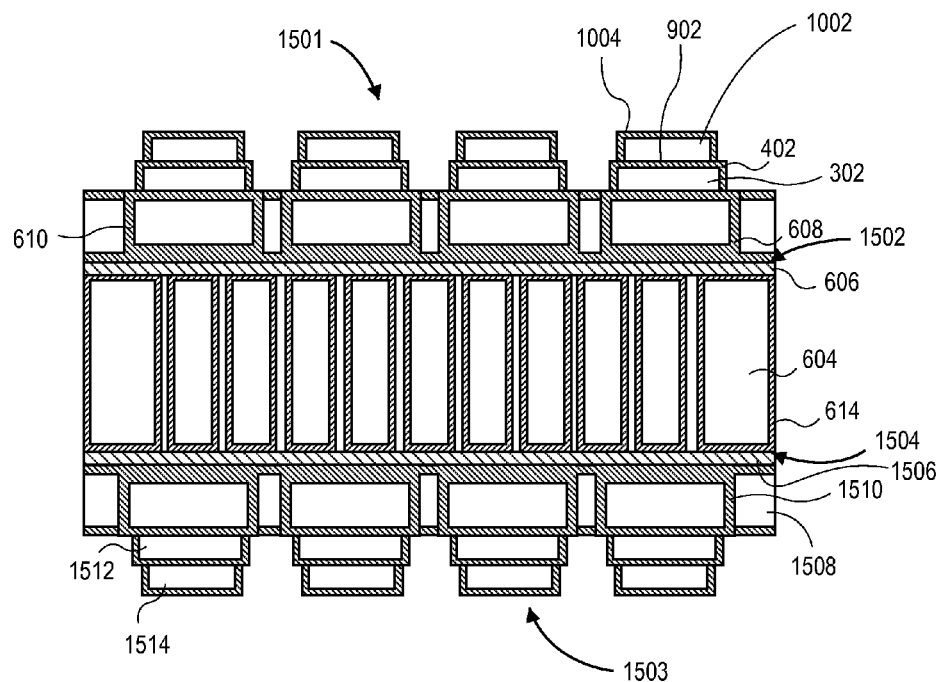
FIG. 15 schematically illustrates a cross-sectional view of one embodiment in which receiving structure and compound semiconductor devices are attached to opposite sides of a receiving substrate.

FIG. 15 schematically illustrates a cross-sectional view of another embodiment for forming a device in which compound devices are bonded to receiving structure positioned along opposing sides of a receiving substrate. Representatively, each of the process steps and components described in references to FIGS. 1-10, which were performed on a first side 1502 of receiving substrate 604, may be duplicated and performed on second side 1504 of receiving substrate 604. In this aspect, in addition to the previously discussed components formed on first side 1502, second side 1504 may have formed thereon release layer 1506, receiving device 1508 having receiving devices 1510 and a stack of compound devices 1512 and 1514 bonded to receiving devices 1510. Each of receiving devices 1510 and compound devices 1512 and 1514 may be covered with dielectric layer 1516. The resulting device stack 1501 formed on first side 1502 and device stack 1503 formed on second side 1504 may be formed simultaneously or one formed followed by formation of the other. The further processing steps described in reference to FIGS. 11-14 may also be performed on device stack 1503 to form devices similar to devices 1402.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. For example, although various process steps are described in a particular order, it is contemplated that one or more of the steps may be performed in a different order. The description is thus to be regarded as illustrative instead of limiting.

What is claimed is:

1. A method comprising:
   forming a release layer over a donor substrate;
   forming a plurality of devices made of a first semiconductor material over the release layer;
   applying a first dielectric layer over the plurality of devices such that all exposed surfaces of the plurality of devices are covered by the first dielectric layer;
   attaching the plurality of devices to it receiving structure made of a second semiconductor material, the receiving structure having a receiving substrate attached to a surface of the receiving structure opposite the plurality of devices, wherein the plurality of devices are a
   first plurality of devices and the receiving structure a first receiving structure; etching the release layer to release the donor substrate from the plurality of devices; and attaching a second, plurality of devices to a second receiving structure positioned along a surface of the receiving substrate opposite the first receiving structure.

2. The method of claim 1 wherein the first semiconductor material is a group IV semiconductor material.

3. The method of claim 1 wherein the first semiconductor material is different from the second semiconductor material and the first semiconductor material is a group III-V semiconductor material.

4. The method of claim 1 wherein attaching comprises chemically bonding the plurality of devices to the receiving devices at room temperature.

5. The method of claim 1 wherein the release layer is made of a material that can be etched using, an etchant that does not substantially remove the first dielectric layer.

6. The method of claim 1 wherein the release layer is made of AlInP and the etchant is HCl or the release layer is made of silicon and the etchant is $XeF_2$.

7. The method of claim 1 wherein the plurality of devices are a first plurality of devices and the method further comprises:
   attaching a second plurality of devices to respective ones of the first plurality of devices.

8. The method of claim 1 further comprising:
   applying a second dielectric layer over the plurality of devices and the receiving structure to mechanically attach the plurality of devices to the receiving structure; and depositing metal contacts on the plural it of devices.

9. The method of claim 1 further comprising:
attaching a handle substrate, to the plurality of devices; and
removing the plurality of devices and the receiving structure from the receiving substrate.

10. The method of claim 1 wherein one of the donor substrate and the receiving substrate is a structured wafer having holes extending vertically through a thickness of the structured wafer.

11. The method of claim 1 wherein one of the first dielectric layer and the second dielectric layer is from 0.01 µm to 1 µm.

12. A method comprising:
forming a donor device comprising a plurality of devices attached to a donor substrate, the plurality of devices made of a compound semiconductor material and positioned between a release layer formed over the donor substrate and a first dielectric layer formed over the plurality of devices;
attaching the plurality of devices to a receiving device at room temperature, the receiving structure having a plurality of receiving devices made of a different material than the plurality devices and attached to a receiving substrate at a side opposite the plurality devices;
etching the release layer to release the plurality of devices from the donor substrate, wherein the etchant selectively removes the release layer without substantially removing the first dielectric layer;
applying a second dielectric layer over the plurality of devices and the receiving structure to cover any exposed surfaces of the plurality of devices and mechanically attach the plurality of devices to the receiving devices;
attaching a handle substrate to the plurality devices; and
removing the plurality of devices and the receiving structure from the receiving substrate.

13. The method of claim 12 wherein the first semiconductor material is a group semiconductor material.

14. The method of claim 12 wherein attaching comprises bonding the plurality of devices to the receiving structure at room temperature.

15. The method of claim 12 wherein the release layer is made of A Ile and the etchant is HCl or the release layer is made of silicon and the etchant is $XeF_2$.

16. The method of claim 12 wherein the plurality of devices are a first plurality of devices and the method further comprises:
after applying the second dielectric layer, attaching a second plurality of devices to respective ones of the first plurality or devices.

17. The method of claim 12 further comprising:
adding functionality to the plurality of devices, the functionality being different than a functionality of the receiving devices.

* * * * *